(12) United States Patent
Kotani et al.

(10) Patent No.: US 8,307,310 B2
(45) Date of Patent: Nov. 6, 2012

(54) PATTERN GENERATING METHOD, METHOD OF MANUFACTURING SEMICONDUCTOR DEVICE, COMPUTER PROGRAM PRODUCT, AND PATTERN-SHAPE-DETERMINATION-PARAMETER GENERATING METHOD

(75) Inventors: Toshiya Kotani, Tokyo (JP); Hiromitsu Mashita, Kanagawa (JP); Takafumi Taguchi, Kanagawa (JP); Ryuji Ogawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 414 days.

(21) Appl. No.: 12/683,993

(22) Filed: Jan. 7, 2010

(65) Prior Publication Data

US 2010/0190342 A1 Jul. 29, 2010

(30) Foreign Application Priority Data

Jan. 28, 2009 (JP) .................. 2009-017161

(51) Int. Cl.
*G06F 17/50* (2006.01)
*G06F 19/00* (2006.01)
*G06F 17/10* (2006.01)
*G06F 7/60* (2006.01)
*G06K 9/00* (2006.01)

(52) U.S. Cl. .............. 716/51; 716/54; 716/55; 716/111; 382/144; 382/145; 382/154; 700/98; 700/109; 700/120; 700/121; 703/2; 703/14

(58) Field of Classification Search ................... 716/51, 716/54, 55, 111; 382/144–154; 700/98, 700/109, 120, 121; 703/2, 14
See application file for complete search history.

(56) References Cited

U.S. PATENT DOCUMENTS

| | | | |
|---|---|---|---|
| 6,772,089 B2 * | 8/2004 | Ikeda et al. .................... | 702/159 |
| 6,839,470 B2 * | 1/2005 | Ikeda ............................. | 382/266 |
| 7,321,680 B2 * | 1/2008 | Ikeda et al. .................... | 382/145 |
| 7,512,927 B2 * | 3/2009 | Gallatin et al. ................. | 716/51 |
| 7,926,004 B2 * | 4/2011 | Pierrat et al. .................... | 716/50 |
| 2004/0209176 A1 * | 10/2004 | Pierrat ............................. | 430/5 |
| 2005/0055658 A1 * | 3/2005 | Mukherjee et al. ............ | 716/19 |
| 2007/0032896 A1 * | 2/2007 | Ye et al. .......................... | 700/108 |
| 2008/0059930 A1 * | 3/2008 | Abadeer et al. .................. | 716/5 |
| 2008/0127027 A1 * | 5/2008 | Gallatin et al. ................. | 716/19 |
| 2009/0123057 A1 * | 5/2009 | Mukherjee et al. ........... | 382/144 |
| 2009/0172616 A1 * | 7/2009 | Lapanik ............................ | 716/5 |
| 2009/0249266 A1 * | 10/2009 | Pierrat et al. ...................... | 716/4 |
| 2011/0209105 A1 * | 8/2011 | Zhang .............................. | 716/53 |

FOREIGN PATENT DOCUMENTS

JP 2008-98588 4/2008

* cited by examiner

*Primary Examiner* — Phallaka Kik
(74) *Attorney, Agent, or Firm* — Finnegan, Henderson, Farabow, Garrett & Dunner, L.L.P.

(57) ABSTRACT

A pattern generating method includes: extracting, from a shape of a pattern generated on a substrate, a contour of the pattern shape; setting evaluation points as verification points for the pattern shape on the contour; calculating curvatures on the contour in the evaluation points; and verifying the pattern shape based on whether the curvatures satisfy a predetermined threshold set in advance.

21 Claims, 8 Drawing Sheets

PATTERN GENERATING METHOD, METHOD OF MANUFACTURING SEMICONDUCTOR DEVICE, COMPUTER PROGRAM PRODUCT, AND PATTERN-SHAPE-DETERMINATION-PARAMETER GENERATING METHOD

CROSS-REFERENCE TO RELATED APPLICATIONS

This application is based upon and claims the benefit of priority from the prior Japanese Patent Application No. 2009-17161, filed on Jan. 28, 2009; the entire contents of which are incorporated herein by reference.

BACKGROUND OF THE INVENTION

1. Field of the Invention

The present invention relates to a pattern generating method, a method of manufacturing a semiconductor device, a computer program product, and a pattern-shape-determination-parameter generating method.

2. Description of the Related Art

In recent years, the advance of semiconductor manufacturing technologies is extremely remarkable. Semiconductors (semiconductor integrated circuits) are mass-produced using patterns having a minimum processing dimension of 50 nanometers. To realize microminiaturization of such patterns, it is necessary to set appropriate conditions for a pattern dimension and a pattern shape of a photomask used in performing pattern transfer, an exposure amount and a focus amount in a lithography process, and the like.

In the lithography technology in the past, fluctuation in an exposure amount and focus is a main cause of fluctuation in a pattern dimension. Therefore, it is necessary to set a lithography condition, an optical proximity correction (OPC) condition, design layout and design limitation conditions, and the like such that the pattern dimension is kept within allowable dimensional fluctuation even if the pattern dimension is affected by the fluctuation in the exposure amount and the focus. A section in which dimensional fluctuation is large in a pattern to be formed is called dangerous pattern (hot spot). In the section, it is highly likely that electrical open-circuit and short-circuit are caused, leading to deterioration in yield (see, for example, Japanese Patent Application Laid-Open No. 2008-98588).

However, in the technology disclosed in Japanese Patent Application Laid-Open No. 2008-98588, a processing failure of patterns due to a pattern shape (an embedding failure, collapse of patterns, etc.) cannot be accurately verified (determined). Further, in the technology disclosed in Japanese Patent Application Laid-Open No. 2008-98588, because various data are necessary to verify a processing failure of patterns due to a pattern shape; the processing failure cannot be easily verified.

BRIEF SUMMARY OF THE INVENTION

A pattern generating method according to an embodiment of the present invention comprises: extracting, from a shape of a pattern generated on a substrate, a contour of the pattern shape; setting evaluation points as verification points for the pattern shape on the contour; calculating curvatures on the contour in the evaluation points; and verifying the pattern shape based on whether the curvatures satisfy a predetermined threshold set in advance.

A method of manufacturing a semiconductor device according to an embodiment of the present invention comprises: forming a pattern on a substrate based on a pattern shape determination parameter, which affects a curvature of the pattern, set through verification of the curvature of a pattern shape such that the curvature in a predetermined evaluation point position of a contour of the pattern generated on the substrate through a predetermined semiconductor manufacturing process satisfies a predetermined threshold.

A computer program product having a computer-readable recording medium including a plurality of commands for creating pattern data executable in a computer according to an embodiment of the present invention, the commands causes the computer to execute: extracting, from a shape of a pattern generated on a substrate, a contour of the pattern shape; setting evaluation points as verification points for the pattern shape on the contour; calculating curvatures on the contour in the evaluation points; and verifying the pattern shape based on whether the curvatures satisfy a predetermined threshold set in advance.

A pattern-shape-determination-parameter generating method according to an embodiment of the present invention comprises: generating a pattern shape determination parameter, which affects a curvature of a pattern, set through verification of the curvature of a pattern shape such that the curvature in a predetermined evaluation point position of a contour of the pattern generated on the substrate through a predetermined semiconductor manufacturing process satisfies a predetermined threshold.

A computer program product having a computer-readable recording medium including a plurality of commands for creating a pattern shape determination parameter executable in a computer according to an embodiment of the present invention, the commands causes the computer to execute generating the pattern shape determination parameter, which affects a curvature of a pattern, set through verification of the curvature of a pattern shape such that the curvature in a predetermined evaluation point position of a contour of the pattern generated on the substrate through a predetermined semiconductor manufacturing process satisfies a predetermined threshold.

DETAILED DESCRIPTION OF THE INVENTION

Exemplary embodiments of the present invention are explained in detail below with reference to the accompanying drawings. The present invention is not limited by the embodiments.

Figure 1:
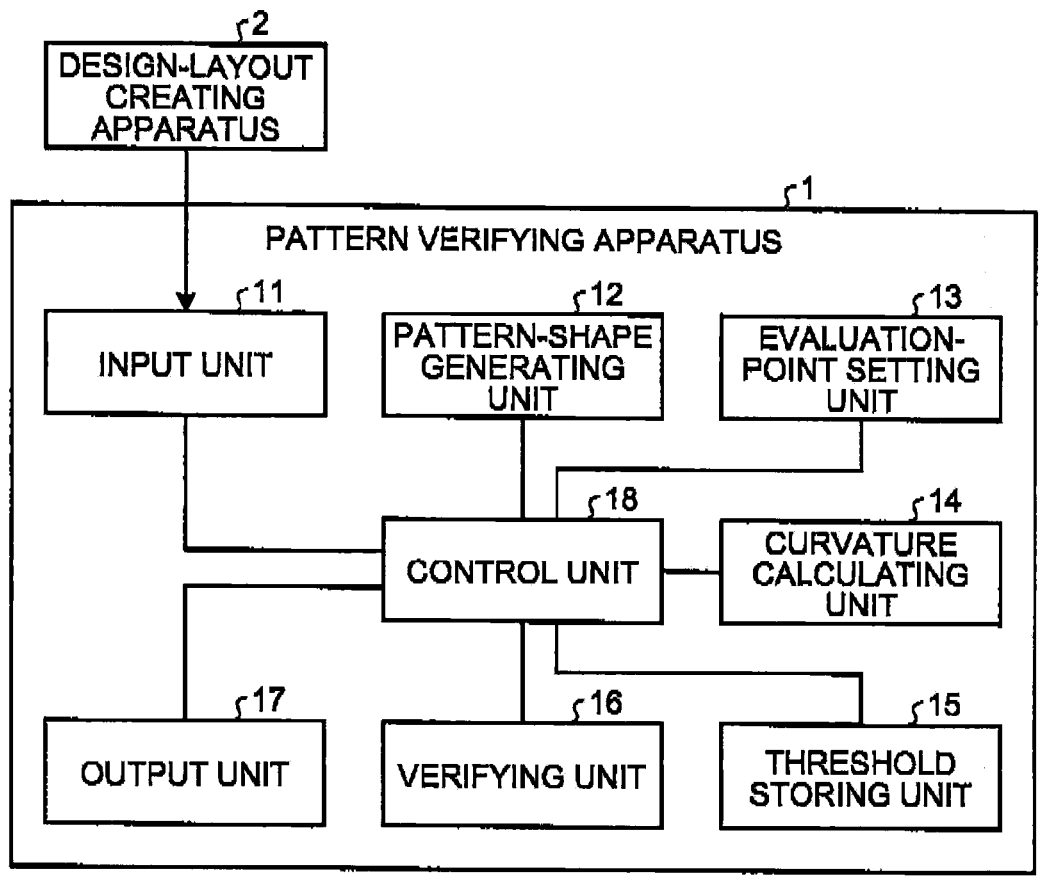
FIG. 1 is a block diagram of the configuration of a pattern verifying apparatus according to a first embodiment of the present invention.

FIG. 1 is a block diagram of the configuration of a pattern verifying apparatus according to a first embodiment of the present invention. A pattern verifying apparatus (a pattern generating apparatus) 1 is an apparatus such as a computer that verifies (determines) dimensions and shapes of mask pattern data of a photomask used for photolithography and pattern data of a template used for imprint lithography in a semiconductor-device manufacturing process. In this embodiment, a verifying apparatus for the mask pattern data (a mask pattern) of the photomask used for the photolithography and a method using the apparatus are explained.

A design-layout creating apparatus 2 is an apparatus such as a computer that creates a design layout (layout data as a base of a mask pattern) of a circuit pattern that should be formed on a substrate. The pattern verifying apparatus 1 creates a mask pattern from the design layout created by the design-layout creating apparatus 2 and predicts, based on the mask pattern, a pattern formed on a substrate (a semiconductor substrate) such as a wafer. The pattern verifying apparatus 1 verifies a dimension and a shape of the pattern (a semiconductor integrated circuit pattern) formed on the substrate.

The pattern verifying apparatus 1 includes an input unit 11, a pattern-shape generating unit 12, an evaluation-point setting unit 13, a curvature calculating unit 14, a threshold storing unit 15, a verifying unit 16, an output unit 17, and a control unit 18. The input unit 11 receives the input of a design layout created by the design-layout creating apparatus 2 and sends the design layout to the pattern-shape generating unit 12.

The pattern-shape generating unit 12 applies optical proximity correction (OPC) to the design layout based on a predetermined process conditions and the like to create a mask pattern. The pattern-shape generating unit 12 includes, for example, a lithography simulator and a processing simulator. The pattern-shape generating unit 12 performs lithography simulation and processing simulation such as etching using the created mask pattern to generate a pattern shape (pattern shape data of a processed pattern) formed on a substrate. The pattern-shape generating unit 12 sends the generated pattern shape to the evaluation-point setting unit 13.

The evaluation-point setting unit 13 extracts a contour of a pattern from the pattern shape and sets evaluation points at predetermined intervals on the contour. The extracted contour of the pattern is a contour of the pattern in a substrate plane direction at predetermined height in a substrate vertical direction of the pattern. The evaluation points are evaluation positions of the pattern shape as a verification target. The evaluation-point setting unit 13 sends the extracted contour and the set evaluation points to the curvature calculating unit 14.

The curvature calculating unit 14 calculates curvatures of a pattern edge (a contour line) on the evaluation points using the contour and the evaluation points. The curvatures calculated by the curvature calculating unit 14 are bending degrees (differential coefficients) of curved lines and are rates of change in the direction of the contour line. The curvature calculating unit 14 sends the calculated curvatures to the verifying unit 16 while associating the curvatures with the evaluation points.

The threshold storing unit 15 is a memory or the like that stores verification reference values (thresholds of curvatures) for determining whether the curvatures of the evaluation points are within tolerance. The threshold storing unit 15 stores, for example, thresholds corresponding to the positions of the evaluation points for each of the evaluation points. In this embodiment, the curvatures of the evaluation points are elements used for pattern verification.

The verifying unit 16 verifies, for each of the evaluation points, whether the curvature of the evaluation point is within the tolerance by comparing the curvature calculated by the curvature calculating unit 14 and the threshold stored by the threshold storing unit 15. The verifying unit 16 sends a verification result concerning the curvature of the evaluation point to the output unit 17. When the curvature is equal to or smaller than the threshold, the verifying unit 16 verifies that the evaluation point is acceptable. When the curvature is larger than the threshold, because the pattern is highly likely to be destroyed by stress or the like of the pattern, the verifying unit 16 verifies that the evaluation point is unacceptable.

The output unit 17 outputs a verification result concerning the curvature of the evaluation point. The output unit 17 can transmit the verification result concerning the curvature of the evaluation point to an external apparatus or can cause a display unit such as a liquid crystal monitor to display the verification result. The control unit 18 controls the input unit 11, the pattern-shape generating unit 12, the evaluation-point setting unit 13, the curvature calculating unit 14, the threshold storing unit 15, the verifying unit 16, and the output unit 17.

Figure 2:
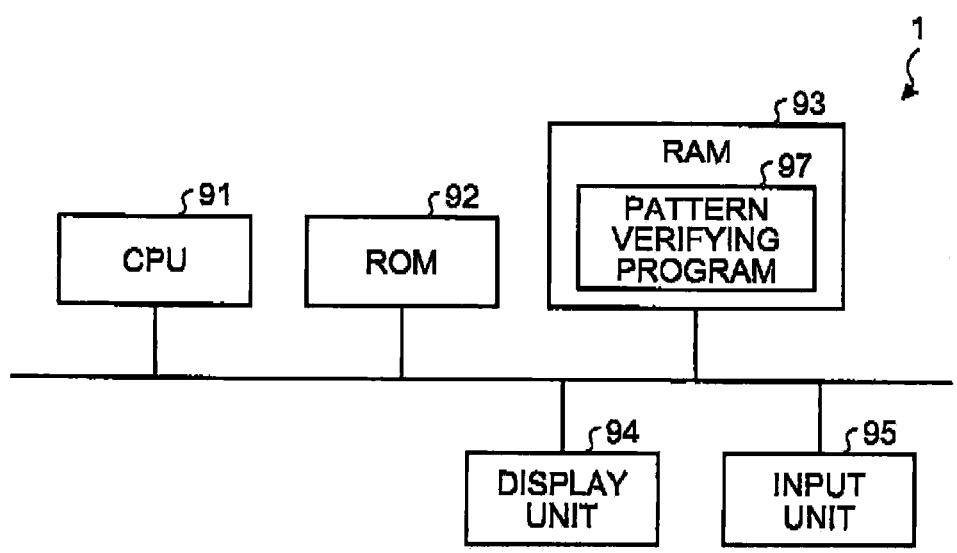
FIG. 2 is a diagram of the hardware configuration of the pattern verifying apparatus.

FIG. 2 is a diagram of the hardware configuration of the pattern verifying apparatus. The pattern verifying apparatus 1 is an apparatus such as a computer that verifies dimensions and shapes of patterns (a design layout, a mask pattern, a resist pattern, a post-etching pattern, a post-film formation pattern, etc.) used in the semiconductor-device manufacturing process. The pattern verifying apparatus 1 includes a central processing unit (CPU) 91, a read only memory (ROM) 92, a random access memory (RAM) 93, a display unit 94, and an input unit 95. In the pattern verifying apparatus 1, the CPU 91, the ROM 92, the RAM 93, the display unit 94, and the input unit 95 are connected to one another via a bus line.

The CPU 91 performs verification of a pattern using a pattern verifying program (pattern generating program) 97 as a computer program for performing verification of a pattern. The pattern verifying program 97 according to this embodiment includes an OPC program for performing OPC, a lithography simulation program for performing lithography simulation, a processing simulation program for performing processing simulation of etching, film formation, and the like, an evaluation-point setting program for performing setting of evaluation points, a curvature calculating program for performing calculation of curvatures, and a verifying program for performing verification of a shape and a dimension of a pattern.

The display unit 94 is a display device such as a liquid crystal monitor. The display unit 94 displays, based on an instruction from the CPU 91, a mask pattern, a pattern shape subjected to lithography simulation, a pattern shape subjected to processing simulation, a verification result of a pattern, and the like. The input unit 95 includes a mouse and a keyboard and receives the input of instruction information (parameters necessary for verification of a pattern, etc.) (setting intervals, thresholds, etc. of evaluation points) input from the outside by a user. The instruction information input to the input unit 95 is sent to the CPU 91.

The pattern verifying program 97 is stored in the ROM 92 and loaded to the RAM 93 via the bus line. The CPU 91 executes the pattern verifying program 97 loaded in the RAM 93. Specifically, in the pattern verifying apparatus 1, the CPU 91 reads out, according to instruction input by the user from the input unit 95, the pattern verifying program 97 from the ROM 92, expands the pattern verifying program 97 in a program storage area in the RAM 93, and executes various kinds of processing. The CPU 91 temporarily stores various data generated in the various kinds of processing in a data storage area formed in the RAM 93.

The ROM 92 can stores the OPC program, the lithography simulation program, the processing simulation program, the evaluation-point setting program, the curvature calculating program, and the verifying program as separate programs.

Figure 3:
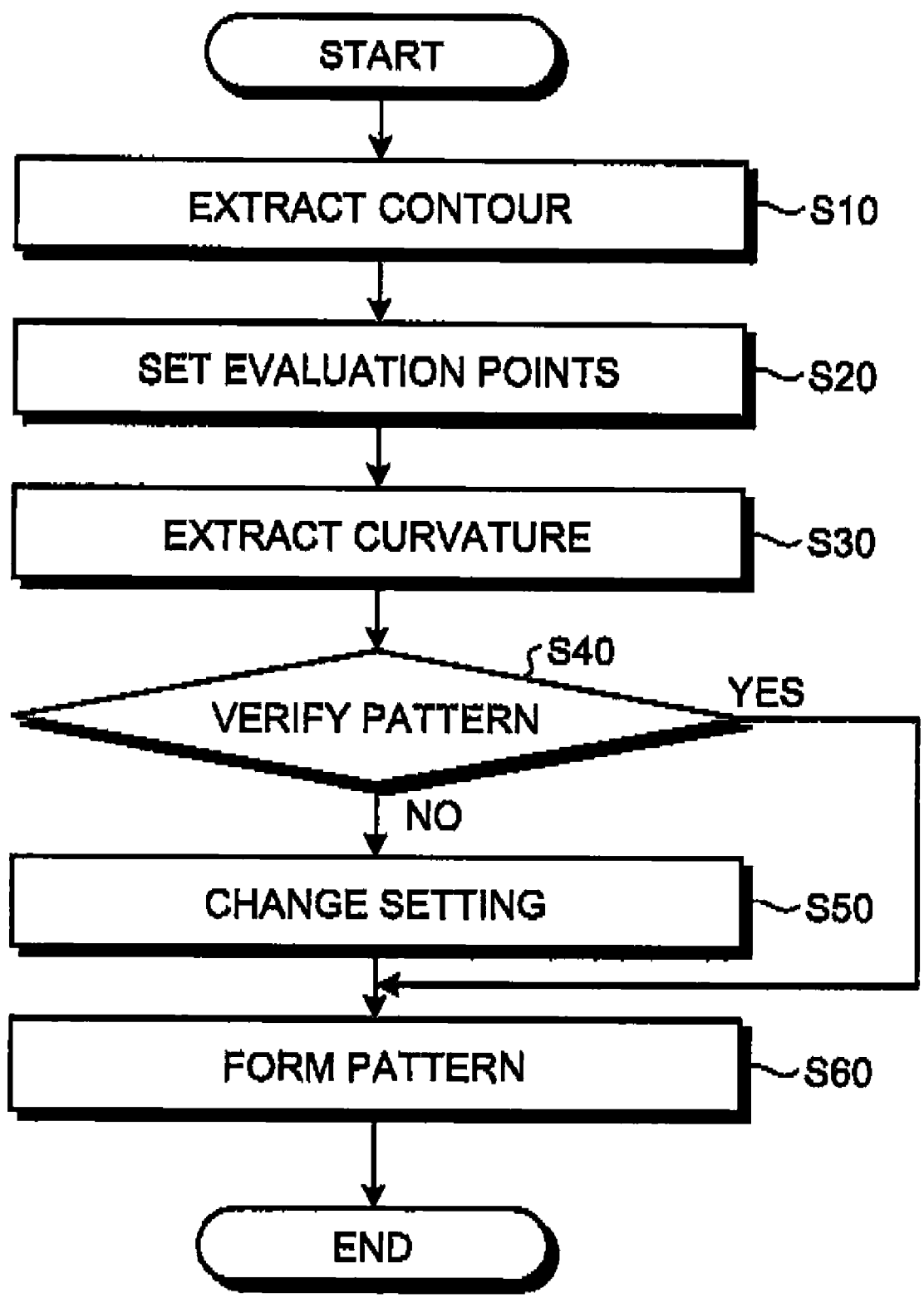
FIG. 3 is a flowchart for explaining a pattern verification processing procedure.
Figure 4A:
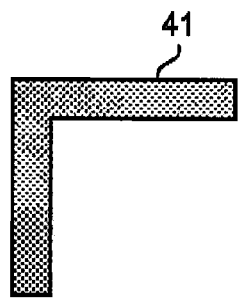
FIGS. 4A to 4D are diagrams for explaining a pattern verifying method.

FIG. 3 is a flowchart for explaining a pattern verification processing procedure. FIGS. 4A to 4D are diagrams for explaining a pattern verifying method. A design layout (Design) 41 drawn by a designer using the design-layout creating apparatus 2 is input to the input unit 11 of the pattern verifying apparatus 1 in advance (FIG. 4A). The input unit 11 sends the design layout 41 created by the design-layout creating apparatus 2 to the pattern-shape generating unit 12.

Figure 4B:
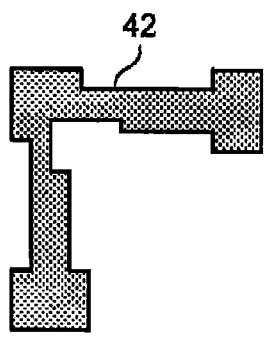
Figure 4C:
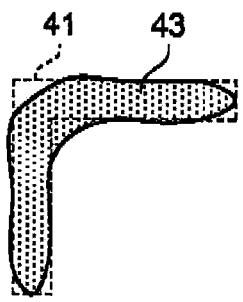

The pattern-shape generating unit 12 applies the OPC to the design layout 41 based on the process conditions and the like to thereby create a mask pattern (Mask) 42 (FIG. 4B). The pattern-shape generating unit 12 performs lithography simulation and processing simulation using the created mask pattern 42 to generate a pattern shape (Wafer) (pattern shape data) 43 formed on a substrate (FIG. 4C). The pattern-shape generating unit 12 sends the generated pattern shape 43 to the evaluation-point setting unit 13.

Figure 4D:
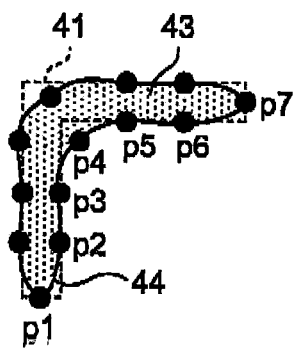

The evaluation-point setting unit 13 extracts a contour 44 of a pattern from the pattern shape 43 (step S10) and sets evaluation points at intervals smaller than the predetermined intervals on the contour 44 (step S20). In FIG. 4D, the evaluation points are shown as, for example, evaluation points p1 to p7 indicated by black circles. In the following explanation, for convenience of explanation, the evaluation points are explained as evaluation points P. The evaluation-point setting unit 13 sends the extracted contour 44 and the set evaluation points P to the curvature calculating unit 14.

The curvature calculating unit 14 calculates curvatures of the contour line on the evaluation points P using the contour 44 and the evaluation points P (step S30). For example, the curvature calculating unit 14 calculates curvatures of the respective evaluation points p1 to p7. The curvature calculating unit 14 sends the calculated curvatures and the evaluation points P to the verifying unit 16 while associating the curvatures and the evaluation points P.

The verifying unit 16 compares the curvatures calculated by the curvature calculating unit 14 and thresholds (predetermined values) stored by the threshold-storing unit 15 to thereby verify, for each of the evaluation points P, whether the curvature of the evaluation point P is within tolerance. The verifying unit 16 verifies that a pattern (the evaluation point P) having the curvature larger than the threshold is a dangerous point (a pattern highly likely to cause a failure) (step S40).

Figure 5:
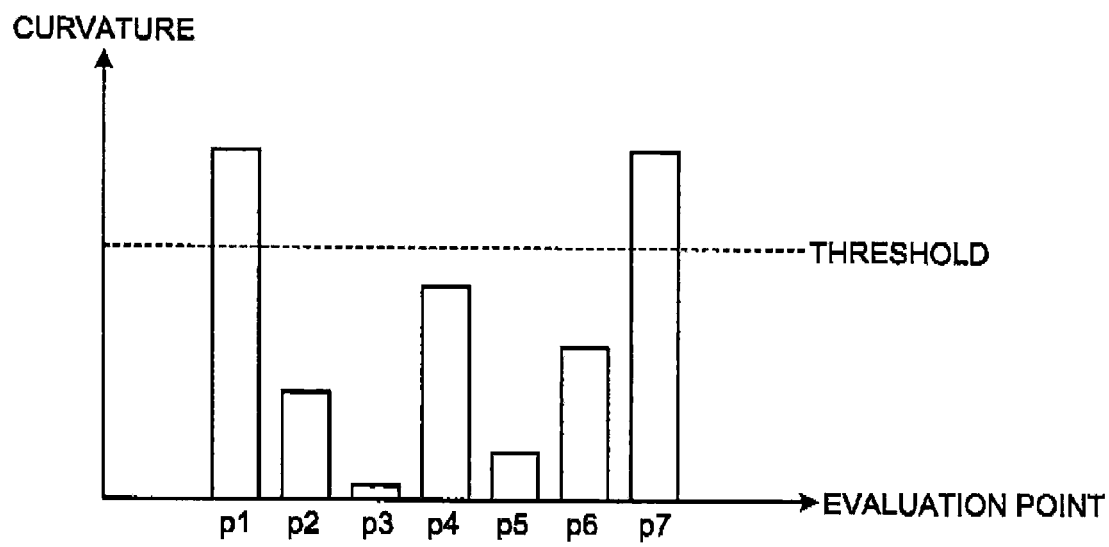
FIG. 5 is a graph of a relation between evaluation points and thresholds.

FIG. 5 is a graph of a relation between evaluation points and thresholds. As shown in the figure, the verifying unit 16 calculates curvatures for the respective evaluation points (the evaluation points p1 to p7) and compares the curvatures of the evaluation points p1 to p7 and the thresholds to thereby verify whether the evaluation points p1 to p7 are dangerous points.

Causes of the dangerous points are, for example, an open-circuit or short-circuit failure of a pattern due to stress concentration in a bending section of the pattern, a pattern destruction failure involved in expansion or contraction of a pattern forming material due to a thermal process after pattern formation, and an embedding failure of a processing material embedded in the bending section of the pattern. To avoid these failure modes, it is necessary to monitor curvatures of patterns in advance with the method according to this embodiment and verify the patterns.

Figure 6:
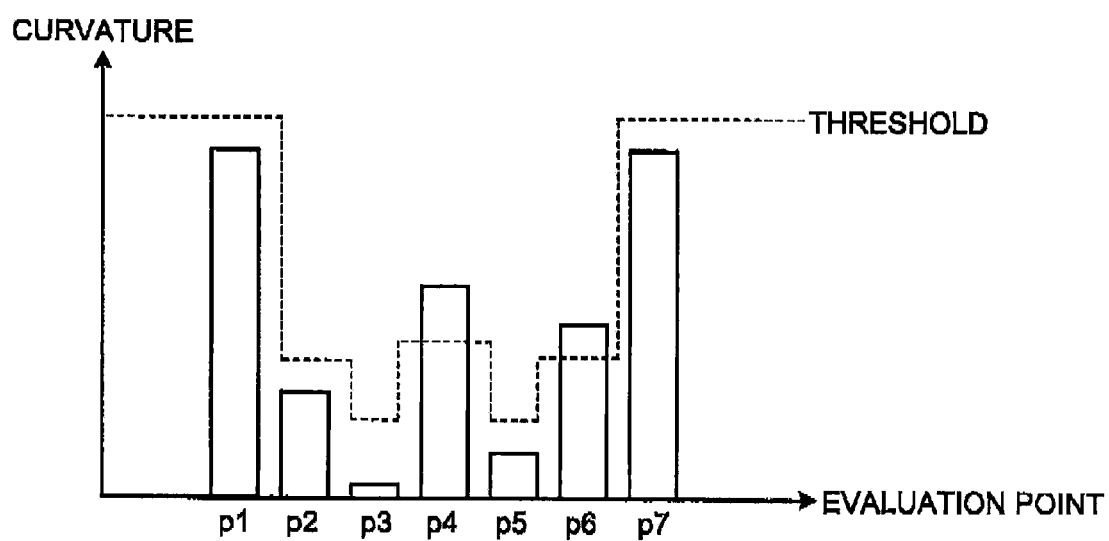
FIG. 6 is a graph of evaluation points and thresholds in which the thresholds are set in the respective evaluation points.

Whether a processing failure occurs depends on pattern line width, a pattern shape, inter-pattern space width, and the like. Therefore, the thresholds of the curvatures can be set to different values according to the pattern line width, the pattern shape, the inter-pattern space width, and the like. Specifically, when the pattern width is large, the threshold is set large and, when the pattern width is small, the threshold is set small. For example, the threshold is set large at a pattern end (e.g., the evaluation point p7) such as a line end. The threshold needs to be set most strict for a pattern having small pattern width and a large curvature. The threshold is set small around a pattern section having a small curvature on a design layout, for example, the evaluation point p3 shown in FIG. 4. Conversely, the threshold is set large around a pattern section having a large curvature on the design layout, for example, the evaluation point p7 shown in FIG. 4. FIG. 6 is a diagram of a relation between evaluation points and thresholds in which the thresholds are set for the respective positions of the valuation points. As shown in the figure, because the thresholds are set for the respective positions of the evaluation points P, even at the evaluation points P having the same curvature, verification results concerning whether the evaluation points P are dangerous points are different. This makes it possible to perform verification of patterns according to positions of the evaluation points P.

As parameters for determining a shape and a dimension of a pattern formed on a substrate (pattern shape determination parameters), for example, there are a design layout, a mask pattern, OPC conditions (a type of a simulation model, the length of a jog, the thickness of a sub-resolution assist feature (SRAF), and an arrangement position of the SRAF), lithography conditions (an illumination shape of an exposing apparatus, the size of a lens, a mask dimension, a phase, transmittance, types and thicknesses of a resist film and a base film under the resist film, and a type of developing liquid), bake conditions (bake temperature and time) in a bake process before and after exposure, and etching conditions (a gas flow rate, a gas type, etching time, and types and thicknesses of a resist film as a mask material and a film to be processed as a pattern forming material) in a processing process. The jog is a grid dimension used for rendering of the mask pattern 42. The SRAF is a pattern on mask adjacent to a mask pattern of a pattern, which should be transferred onto the substrate, and originally not transferred onto the substrate and is an auxiliary pattern having width smaller than limit resolution during the transfer onto the substrate.

Therefore, as a method of generating a pattern that satisfies the threshold, there is a method of appropriately setting or changing the pattern shape determination parameters such as a change of a design layout, a change of a mask pattern, a change of lithography conditions, a change of OPC conditions, a change of bake conditions, a change of a type and thickness of a base film during lithography, and a change of etching conditions in a processing process. It is possible to form a pattern having a curvature equal to or smaller than the threshold by appropriately adjusting these parameters.

Figure 7:
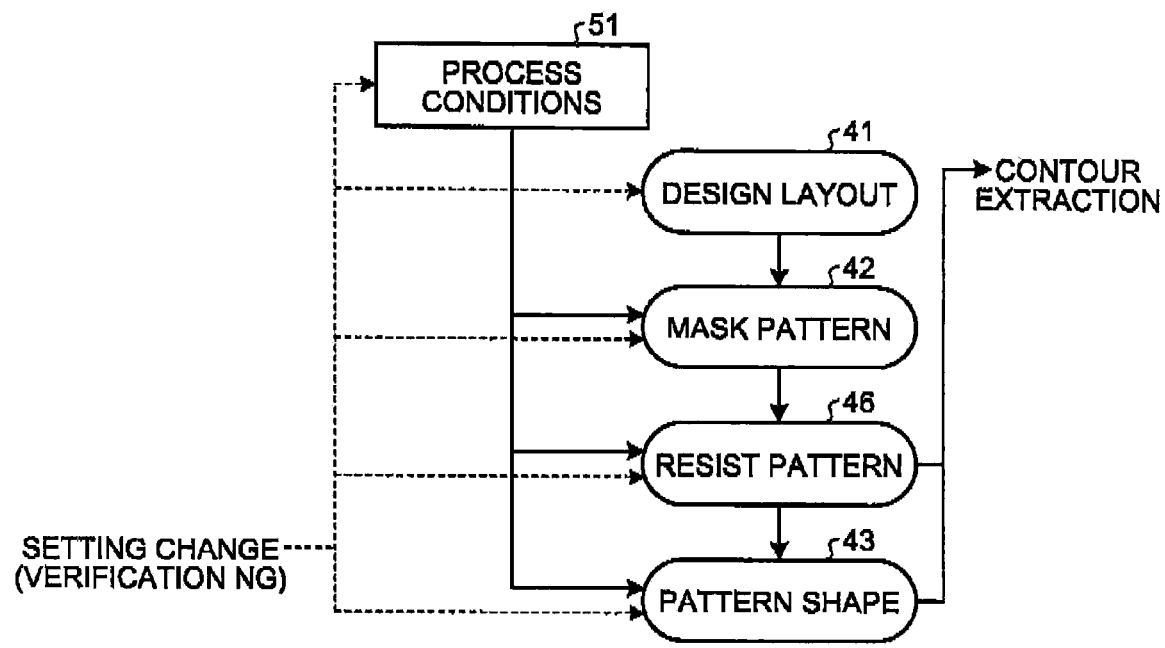
FIG. 7 is a diagram for explaining a pattern generating method.

FIG. 7 is a diagram for explaining a method of generating a pattern. When a pattern (a processed pattern) is formed on a substrate, the mask pattern 42 is generated based on the design layout 41. A resist pattern 46 is predicted (generated by simulation) based on the mask pattern 42. The pattern shape 43 after processing is predicted based on the resist pattern 46. Among these data, the mask pattern 42, the resist pattern 46, and the pattern shape 43 after processing are data generated based on process conditions 51. The resist pattern 46 and the pattern shape 43 after processing are used when the contour 44 of a pattern as a verification target is extracted. The pattern shape 43 after processing can be a pattern shape after etching performed by using the resist pattern 46 as a mask or can be a pattern shape including a sidewall film formed by using, as a core, the resist pattern 46 or another hard mask pattern formed by transferring the resist pattern 46. In the following explanation of this embodiment, the contour 44 of a pattern is extracted from the pattern shape 43 after processing.

When it is verified that the curvature of the evaluation point P is not within the tolerance (in the case of verification NG) ("NO" at step s40), it is necessary to perform correction (setting change) for the pattern shape determination parameters. As a method of performing correction of the pattern shape determination parameters such that the curvature of the evaluation point P satisfies the threshold, for example, the settings of the design layout 41, the mask pattern 42, the resist pattern 46, and the pattern shape 43 after processing are changed (step S50). When the design layout 41 is changed, the design layout 41 itself is changed. When the resist pattern 46 and the pattern shape 43 after processing are changed, target values (targets) of the resist pattern 46 and the pattern shape 43 after processing and the process conditions 51 are changed. When the mask pattern 42 is changed, the mask pattern 42 itself can be changed or the process conditions 51 can be changed.

When the design layout 41 has been changed, the mask pattern 42 is also changed according to the change. When the mask pattern 42 has been changed, the resist pattern 46 is also changed according to the change. When the resist pattern 46 has been changed, the pattern shape 43 after processing is also changed according to the change.

Figure 8:
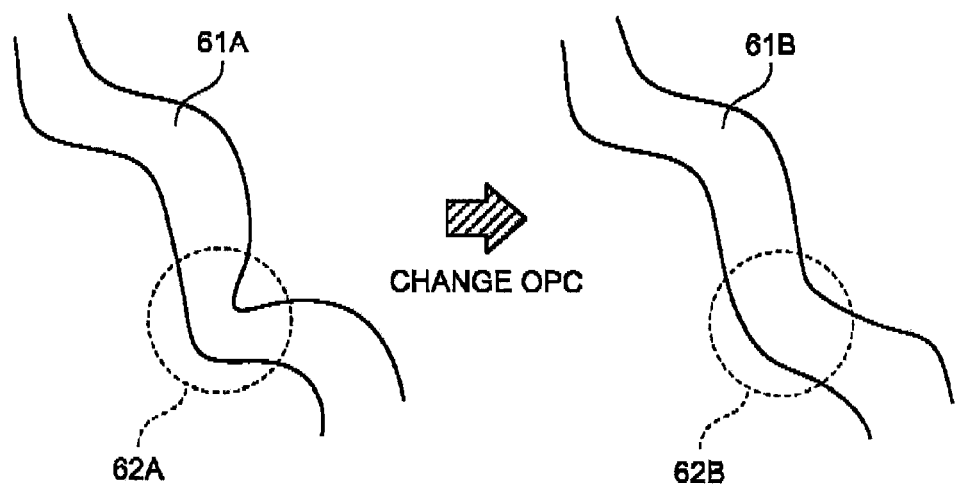
FIG. 8 is a diagram for explaining processing for changing a pattern shape.

FIG. 8 is a diagram for explaining an example of processing for changing a pattern shape. For example, the mask pattern 42 is changed by changing the OPC in generating the mask pattern 42 from the design layout 41. The pattern shape 43 after processing fluctuates according to the change. When the mask pattern 42 before the OPC change is used, the pattern shape 43 after processing may include, for example, a pre-change pattern 61A having a dangerous point 62A. If the OPC is changed such that a curvature at the dangerous point 62A is equal to or smaller than the threshold, when the mask pattern 42 after the OPC change is used, the pattern shape 43 after processing includes, for example, a post-change pattern 61B with the dangerous point 62A eliminated and having a safe point 62B. Consequently, the dangerous point 62A is not present in the pattern shape 43 after processing.

When it is verified that the curvature of the evaluation point P is within the tolerance ("YES" at step S40), a pattern is formed on the substrate by using the mask pattern 42 without performing correction of the pattern shape determination parameters (step S60).

After the setting change for the design layout 41, the mask pattern 42, the resist pattern 46, the pattern shape 43 after processing, and the like is performed, the processing at steps S10 to S40 (the pattern verification processing) can be performed again. The pattern verifying apparatus 1 repeats the pattern verification processing and the setting change until a curvature of a pattern shape after the setting change decreases to be equal to or smaller than the threshold.

The pattern verification and the setting change are performed, for example, for each kind of exposure processing (for each layer). When the mask patterns 42 are determined in the respective kinds of exposure processing, exposure processing, etching, and the like on the substrate are performed using the respective mask patterns 42. Consequently, a semiconductor device, a finish pattern of which is already verified by the pattern verifying apparatus 1, having appropriate patterns in respective layers is manufactured.

As explained above, to form a semiconductor integrated circuit pattern having a desired shape on the substrate, the pattern verifying apparatus 1 generates the mask pattern 41 corresponding to the semiconductor integrated circuit pattern. The pattern verifying apparatus 1 simulates a step of transferring the mask pattern 41 onto a resist (a photosensitive agent) applied on the substrate or a laminated film and a step of forming a pattern (a circuit pattern) on the photosensitive agent or the laminated film through development of the photosensitive agent. Further, the pattern verifying apparatus 1 calculates a curvature on a contour line of the pattern generated by the simulation and verifies, whether the curvature satisfies a threshold set in advance. When the curvature does not satisfy the threshold, the pattern verifying apparatus 1 changes at least one or more pattern shape determination parameters such as the design layout 41, the mask pattern 42, a type and thickness of the laminated film, and a development condition, an exposure condition, and the like such that the curvature satisfies the threshold.

In this way, a pattern shape having a large curvature is extracted and an element for determining a pattern shape is changed. Therefore, it is possible to prevent a failure that could lead to electrical open-circuit or short-circuit due to stress rupture or an embedding failure of the pattern and realize improvement of yield at an early stage.

In this embodiment, the contour 44 is extracted from the pattern shape 43, which is the pattern shape after processing, to set the evaluation points P. However, the contour 44 can be extracted from the resist pattern 46 to set the evaluation points P.

In this embodiment, the resist pattern is formed by the photolithography. However, the resist pattern can be formed by imprint lithography. In this case, a resist pattern obtained by etching a residual film of the resist pattern can be set as the pattern shape after processing. A pattern obtained by etching and processing a film to be processed of a lower layer using the resist pattern as a mask can be set as the pattern shape after processing.

In the explanation of the embodiment, a pattern shape formed on the substrate by the lithography simulation or the processing simulation is generated. However, a pattern shape can be generated by actually forming a pattern on the substrate. In this case, the pattern-shape generating unit 12 applies the OPC to a design layout to form a mask pattern. The pattern-shape generating unit 12 forms a photomask using the mask pattern and forms a pattern on the substrate according to processing such as exposure, development, and etching.

In the explanation of this embodiment, the pattern verifying apparatus 1 creates a mask pattern. However, a mask pattern can be created by another apparatus. In this case, the pattern verifying apparatus 1 generates a pattern shape using the mask pattern created by the other apparatus. The lithography simulation, the processing simulation, the contour extraction, and the evaluation point setting can be performed by an apparatus other than the pattern verifying apparatus 1.

In the explanation of the embodiment, the pattern verifying program 97 includes the OPC program, the lithography simulation program, the processing simulation program, and the evaluation-point setting program. However, the OPC, the lithography simulation, the processing simulation, the setting of evaluation points, and the like can be performed by a computer program other than the pattern verifying program 97.

In the explanation of the embodiment, the pattern verifying apparatus 1 generates a pattern shape. However, a pattern shape can be generated by another apparatus. In this case, the pattern verifying apparatus 1 extracts a contour from the pattern shape generated by the other apparatus.

In this way, according to the first embodiment, the evaluation points P are set on the pattern shape obtained by the simulation and a processing failure of the pattern is verified based on curvatures on the evaluation points P. Therefore, it is possible to accurately and easily verify a processing failure of the pattern due to the pattern shape.

In a second embodiment of the present invention, A dimension and a shape of a pattern formed by using a sidewall process are verified. In this embodiment, as in the first embodiment, a processing failure of the pattern is verified based on curvatures on the evaluation points P. The configuration of the pattern verifying apparatus 1 and a pattern verification processing procedure are the same as those in the first embodiment. Therefore, explanation of the configuration and the pattern verification processing procedure is omitted.

The optical lithography technology has a resolution limit dimension. As a method of forming a pattern equal to or smaller than the resolution limit dimension, there is a method of attaining a fine pattern dimension by combining the etching technology or the film formation technology with the lithography technology. One method for forming a line & space (LS) pattern equal to or smaller than the resolution limit dimension is a sidewall process.

The sidewall process is performed according to a procedure of (1) to (5) explained below.

(1) A resist pattern is formed on a film to be processed present on a substrate. A pattern having a pitch twice as large as desired line width is formed in advance by a lithography process.

(2) The pattern is slimmed to the desired line width by a slimming technology. The pattern after the slimming can be a pattern obtained by processing the film to be processed using a resist material (a photosensitive agent) as a mask or can be the resist pattern. For example, a reactive ion etching (RIE) or wet etching technology is used for the slimming.

(3) A sidewall material is deposited on sidewalls of the pattern after the slimming by the thickness of the desired line width.

(4) The sidewall material is left by selectively removing the pattern after the slimming (a core pattern or a column pattern).

(5) The film to be processed of a base is processed by using the sidewall material as a mask and a pattern (a fine pattern) having a desired dimension if formed on the film to be processed of the base.

Figure 9A:
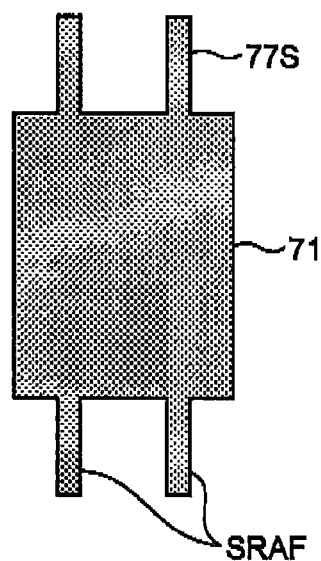
FIGS. 9A to 9F are diagrams for explaining a processing failure that occurs when sub-resolution assist feature (SRAF) patterns are used.
Figure 9B:
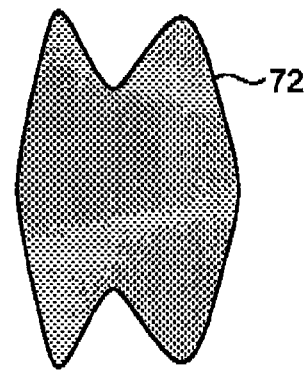
Figure 9C:
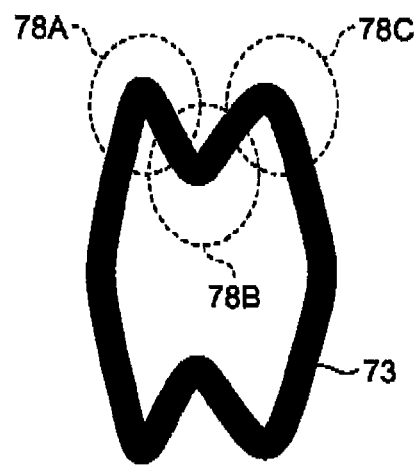
Figure 9D:
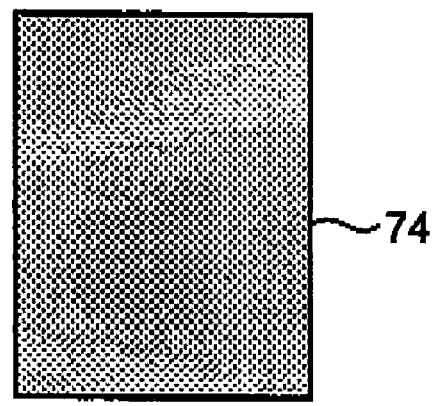
Figure 9E:
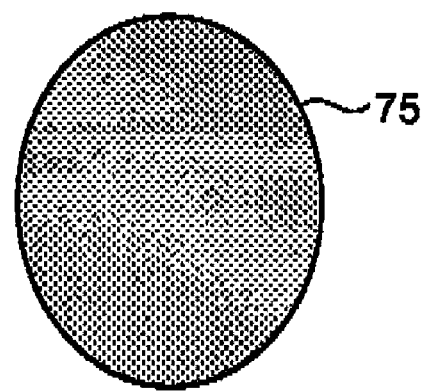
Figure 9F:
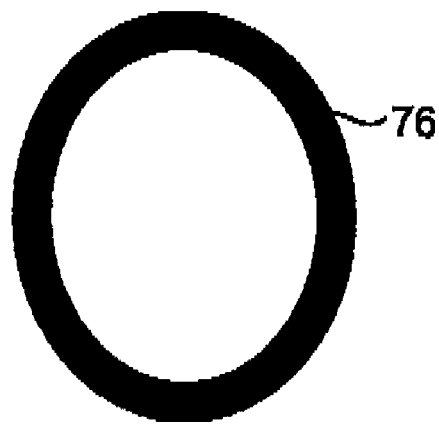

By using such a sidewall process, it is possible to form an LS pattern having a pitch a half as large as the resolution limit of the optical lithography. FIGS. 9A to 9F are diagrams for explaining a processing failure that occurs when SRAF patterns are used. FIGS. 9A to 9C are diagrams of a resist pattern 72 and a pattern shape 73 after processing generated by using a mask pattern 71 having SRAF patterns 77S. FIGS. 9D to 9F are diagrams of a resist pattern 75 and a pattern shape 76 after processing generated by using a mask pattern 74 from which the SRAF patterns 77S are removed.

When the mask pattern 71 having the SRAF patterns 77S shown in FIG. 9A is used, a resist shape on a substrate is the resist pattern 72 (FIG. 9B). The pattern shape 73 after processing is formed through the sidewall process (FIG. 9C). The pattern shape 73 is, for example, an insulator. A wiring metal film or the like is embedded in a section where the pattern shape 73 is not formed.

When the SRAF patterns 77S are used, a resist waviness shape that occurs near the SRAF patterns 77S is changed to fine bending patterns 78A to 78C by the sidewall process. The bending patterns 78A to 78C may become dangerous points that cause electrical open-circuit and short-circuit such as stress rupture and an embedding failure.

The pattern verifying apparatus 1 according to this embodiment can sense the dangerous points beforehand by monitoring curvatures of the bending patterns 78A to 78C. When it is verified that the bending patterns 78A to 78C cause failures such as stress rupture and an embedding failure (when the curvatures are larger than the threshold), for example, the SRAF patterns 778 are removed from the mask pattern 71.

When the mask pattern 74 from which the SRAF patterns 775 is removed is used (FIG. 9D), a resist shape on the substrate is the resist pattern 75 (FIG. 9E). The pattern shape 76 after processing is formed through the sidewall process (FIG. 9F). Consequently, the resist waviness can be improved and the occurrence of fine bending patterns after the sidewall process can be suppressed. Therefore, it is possible to prevent the occurrence of dangerous points.

A method of preventing the occurrence of dangerous points can be a method other than the processing for removing the SRAF patterns 77S. For example, it is also possible to control a resist waviness shape by changing an illumination shape (σ) of an exposing apparatus and the size (NA) of a lens. As the illumination shape is smaller a and as the illumination shape has a higher degree of interference (normal illumination<zonal illumination<four-eye illumination<two-eye illumination<point light source), the resist waviness tends to occur more easily. Therefore, it is also possible to control a waviness shape by, for example, reducing a degree of interference of illumination.

In this way, according to the second embodiment, as in the first embodiment, it is possible to accurately and easily verify a processing failure of a pattern due to a pattern shape. By applying the pattern verification according to the first embodiment to the sidewall process, even when a dangerous pattern peculiar to the sidewall process occurs, it is possible to accurately verify whether the dangerous pattern is a dangerous point. Therefore, it is possible to perform setting change to prevent a dangerous point from occurring. This makes it possible to Minimize yield impact.

In a third embodiment of the present invention, verification of a pattern is performed by verifying whether waviness in a sectional direction causes a processing failure. In this embodiment, a processing failure of a pattern is verified based on curvatures on the evaluation points P set in the sectional direction. The configuration of the pattern verifying apparatus 1 and a pattern verification processing procedure are the same as those in the first embodiment. Therefore, explanation of the configuration and the pattern verification processing procedure is omitted.

When a pattern is formed on a substrate, waviness not only in a plane direction but also in the sectional direction may become a dangerous point. Therefore, in this embodiment, the pattern-shape generating unit 12 of the pattern verifying apparatus 1 performs resist simulation and processing simulation in the sectional direction.

Figure 10:
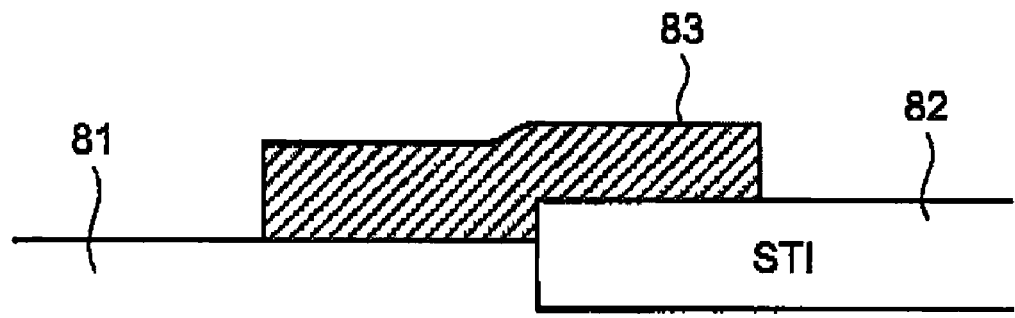
FIG. 10 is a diagram for explaining a post-processing pattern formed on a base step.

Sudden fluctuation in a pattern in the sectional direction that occurs because of a base step also causes stress rupture. FIG. 10 is a diagram for explaining a post-processing pattern formed on the base step. In FIG. 10, a sectional view of the base step and the post-processing pattern is shown. In the following explanation, a pattern shape verification target is the post-processing pattern after etching or the like. However, patterns in other processes such as a resist pattern can be the pattern shape verification target.

For example, when a post-processing pattern 83 is formed on a base step (an STI step) formed between a diffusion layer 81 as an element area and a shallow trench isolation (STI) 82 as a non-element area, the post-processing pattern 83 may be stress-ruptured near the base step section. The post-processing pattern 83 is, for example, fine wiring. As the base step, there is a step of wiring on a contact hole besides the step between the element area and the non-element area. Fine wiring set on the step may be stress-ruptured.

Figure 11:
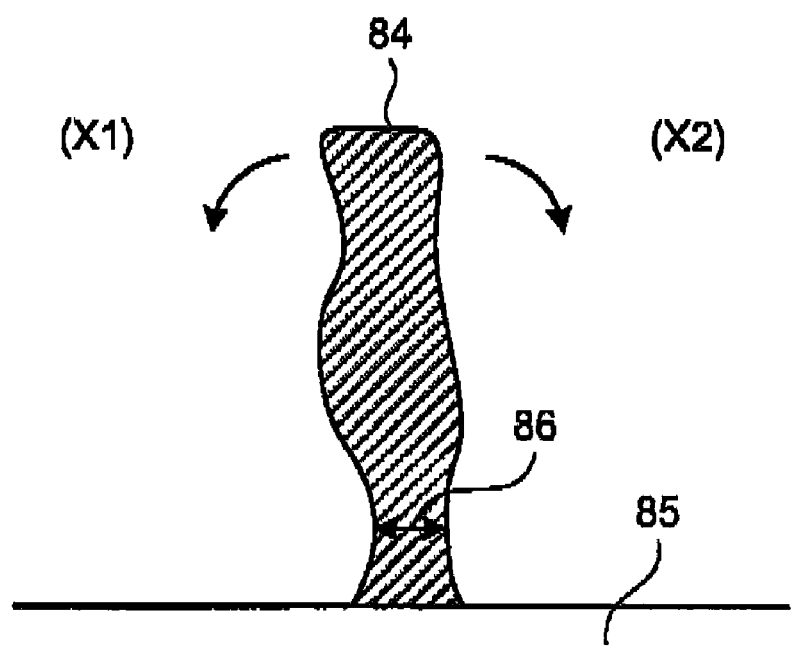
FIG. 11 is a diagram for explaining pattern waviness in a sectional direction.

FIG. 11 is a diagram for explaining pattern waviness in the sectional direction. In FIG. 11, a sectional view of a base film and a post-processing pattern is shown. In a post-processing pattern 84 such as fine wiring, a section having a dimension locally narrowed in the sectional direction (a narrowed pattern 86) occurs because of unevenness of light intensity during a lithography process. Such a narrowed pattern 86 has small strength compared with other sections and may collapse in a direction X1 and a direction X2.

In this way, the stress rupture of the post-processing pattern 83, the collapse of the post-processing pattern 84, or the like may occur because of the waviness in the sectional direction. Therefore, in this embodiment, verification of a pattern is performed by verifying whether waviness in the sectional direction causes a processing failure. Specifically, the evaluation points P are set on the sectional direction (sidewall surfaces of the pattern) and a processing failure of a pattern is verified based on curvatures and dimensional widths on the evaluation points P. For a pattern shape in which it is verified that a processing failure of a pattern occurs, it is possible to prevent occurrence of a dangerous point by changing a type of a base film 85, film thickness of the base film 85, a design layout, and the like (changing a step position and changing to thicken wiring width on a step).

In this way, according to the third embodiment, as in the first embodiment, it is possible to accurately and easily verify a processing failure of a pattern due to a pattern shape. By applying the pattern verification according to the first embodiment to the pattern verification in the sectional direction, even when a dangerous pattern occurs because of waviness in the sectional direction, it is possible to accurately verify whether the dangerous pattern is a dangerous point. Therefore, it is possible to perform setting change to prevent a dangerous point from occurring. This makes it possible to minimize yield impact.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern generating method comprising:
    extracting, from a pattern generated on a substrate, a contour of a pattern shape, the pattern being generated by:
        forming sidewall films on sidewalls of a core pattern generated on the substrate; and
        processing the substrate using the sidewall films as mask;
    setting evaluation points on the contour as verification points for the pattern shape;
    calculating curvatures of the contour at the evaluation points; and
    verifying, by a computer, the pattern shape based on whether the curvatures satisfy a predetermined threshold.

2. The pattern generating method according to claim 1, wherein extracting a contour of a pattern shape comprises extracting a contour of a pattern shape in a plane parallel to the substrate.

3. The pattern generating method according to claim 2, wherein the plane parallel to the substrate is a plane at a predetermined height from the substrate in a direction perpendicular to the substrate.

4. The pattern generating method according to claim 1, wherein extracting a contour of a pattern shape comprises extracting a contour of a pattern shape in a plane perpendicular to the substrate.

5. The pattern generating method according to claim 1, wherein verifying the pattern shape comprises verifying a pattern shape for each of the evaluation points using a threshold for each of the evaluation points set according to one of a position of the evaluation point or a pattern dimension at the evaluation point.

6. The pattern generating method according to claim 1, wherein verifying the pattern shape comprises verifying a pattern shape for each of the evaluation points using a threshold for each of the evaluation points set according to at least one of line width of the pattern, a shape of the pattern, or an inter-pattern space width of the pattern.

7. A method of manufacturing a semiconductor device comprising forming a pattern on a substrate based on a pattern shape determination parameter, which affects a curvature of the pattern, set through a verification of the curvature of a pattern shape such that the curvature at a predetermined evaluation point position of a contour of the pattern generated on the substrate through a predetermined semiconductor manufacturing process satisfies a predetermined threshold, the verification comprising:
    extracting, from a test pattern generated on a test substrate, a contour of the pattern shape, the test pattern being generated by:
        forming sidewall films on sidewalls of a core pattern generated on the test substrate; and
        processing the test substrate using the sidewall films as mask;
    setting evaluation points on the contour as verification points for the pattern shape;
    calculating curvatures of the contour at the evaluation points; and
    verifying the pattern shape based on whether the curvatures satisfy a predetermined threshold.

8. The method of manufacturing a semiconductor device according to claim 7, wherein extracting a contour of the pattern shape comprises extracting a contour of the pattern shape in a plane parallel to the test substrate.

9. The method of manufacturing a semiconductor device according to claim 8, wherein the plane parallel to the test substrate is a plane at a predetermined height from the substrate in a direction perpendicular to the test substrate.

10. The method of manufacturing a semiconductor device according to claim 7, wherein extracting a contour of the pattern shape comprises extracting a contour of the pattern shape in a plane perpendicular to the test substrate.

11. The method of manufacturing a semiconductor device according to claim 7, wherein verifying the pattern shape comprises verifying a pattern shape for each of the evaluation points using a threshold for each of the evaluation points set according to one of a position of the evaluation point or a pattern dimension at the evaluation point.

12. The method of manufacturing a semiconductor device according to claim 7, wherein verifying the pattern shape comprises verifying a pattern shape for each of the evaluation points using a threshold for each of the evaluation points set according to at least one of line width of the pattern, a shape of the pattern, or an inter-pattern space width of the pattern.

13. The method of manufacturing a semiconductor device according to claim 7, wherein the pattern shape determination parameter is at least one of a design layout, a type of a simulation model, length of a jog, thickness of an SRAF, an arrangement position of the SRAF, an illumination shape of an exposing device, size of a lens of the exposing device, a dimension of a mask, a phase of the mask, transmittance of the mask, a type of a resist film, thickness of the resist film, a type of a base film under the resist film, a thickness of the base film, a type of developing liquid, a bake temperature in a bake process before and after exposure, a bake time in the bake process, a gas flow rate in a processing process, a gas type in the processing process, an etching time in the processing process, a resist film as a mask material in the processing process, a type of a film to be processed that is a pattern forming material in the processing process, or a thickness of the film to be processed.

14. A non-transitory computer-readable recording medium storing a computer program including a plurality of commands for creating pattern data executable in a computer, the commands causing the computer to execute:
   extracting, from a pattern generated on a substrate, a contour of a pattern shape, the pattern being generated by:
      forming sidewall films on sidewalls of a core pattern generated on the substrate; and
      processing the substrate using the sidewall films as mask;
   setting evaluation points on the contour as verification points for the pattern shape;
   calculating curvatures of the contour at the evaluation points; and
   verifying the pattern shape based on whether the curvatures satisfy a predetermined threshold.

15. The recording medium according to claim 14, wherein causing the computer to execute extracting a contour of a pattern shape comprises causing the computer to execute extracting a contour of a pattern shape in a plane parallel to the substrate.

16. The recording medium according to claim 14, wherein causing the computer to execute extracting a contour of a pattern shape comprises causing the computer to execute extracting a contour of a pattern shape in a plane perpendicular to the substrate.

17. The recording medium according to claim 15, wherein the plane parallel to the substrate is a plane at a predetermined height from the substrate in a direction perpendicular to the substrate.

18. The recording medium according to claim 14, wherein causing the computer to execute verifying the pattern shape comprises causing the computer to execute verifying a pattern shape for each of the evaluation points using a threshold for each of the evaluation points set according to one of a position of the evaluation point or a pattern dimension at the evaluation point.

19. The recording medium according to claim 14, wherein causing the computer to execute verifying the pattern shape comprises causing the computer to execute verifying a pattern shape for each of the evaluation points using a threshold for each of the evaluation points set according to at least one of line width of the pattern, a shape of the pattern, or an inter-pattern space width of the pattern.

20. A pattern-shape-determination-parameter generating method comprising generating, by a computer, a pattern shape determination parameter, which affects a curvature of a pattern, set through verification of the curvature of a pattern shape such that the curvature at a predetermined evaluation point position of a contour of the pattern generated on a substrate through a predetermined semiconductor manufacturing process satisfies a predetermined threshold, the verification comprising:
   extracting, from a test pattern generated on a test substrate, a contour of the pattern shape, the test pattern being generated by:
      forming sidewall films on sidewalls of a core pattern generated on the test substrate; and
      processing the test substrate using the sidewall films as mask;
   setting evaluation points on the contour as verification points for the pattern shape;
   calculating curvatures of the contour at the evaluation points; and
   verifying the pattern shape based on whether the curvatures satisfy a predetermined threshold.

21. A non-transitory computer-readable recording medium storing a computer program including a plurality of commands for creating a pattern shape determination parameter executable in a computer, the commands causing the computer to execute generating the pattern shape determination parameter, which affects a curvature of a pattern, set through verification of the curvature of a pattern shape such that the curvature in a predetermined evaluation point position of a contour of the pattern generated on the substrate through a predetermined semiconductor manufacturing process satisfies a predetermined threshold, the verification comprising:
   extracting, from a test pattern generated on a test substrate, a contour of the pattern shape, the test pattern being generated by:
      forming sidewall films on sidewalls of a core pattern generated on the test substrate; and
      processing the test substrate using the sidewall films as mask;
   setting evaluation points on the contour as verification points for the pattern shape;
   calculating curvatures of the contour at the evaluation points; and
   verifying the pattern shape based on whether the curvatures satisfy a predetermined threshold.

* * * * *